United States Patent
Tong et al.

(10) Patent No.: US 7,944,198 B1
(45) Date of Patent: May 17, 2011

(54) MULTIMETER

(75) Inventors: Song-Lin Tong, Shenzhen (CN); Lan-Yi Feng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 39 days.

(21) Appl. No.: 12/755,380

(22) Filed: Apr. 6, 2010

(30) Foreign Application Priority Data

Jan. 19, 2010 (CN) .......................... 2010 1 0300422

(51) Int. Cl.
*G01R 1/38* (2006.01)
*G01R 11/57* (2006.01)
*G01R 15/00* (2006.01)
*G01R 15/08* (2006.01)

(52) U.S. Cl. ...................................... 324/115

(58) Field of Classification Search ................ None
See application file for complete search history.

*Primary Examiner* — Roberto Velez
(74) *Attorney, Agent, or Firm* — Frank R. Niranjan

(57) ABSTRACT

A multimeter includes a switching circuit. The switching circuit includes a micro control unit (MCU), a first normally-open switch, a second normally-open switch, and an electronic switch. The first and second normally-open switches connect to the MCU. The MCU connects to the electronic switch. The electronic switch connects to a power control terminal of the multimeter. The MCU are operable to detect whether the first and second normally-open switches are both closed and accordingly control the electronic switch to turn on or off. The electronic switch outputs a control signal to the power control terminal of the multimeter to control the multimeter to power on or off.

3 Claims, 2 Drawing Sheets

MULTIMETER

BACKGROUND

1. Technical Field

The present disclosure relates to multimeters.

2. Description of Related Art

A multimeter is usually powered by batteries. Users often forget to turn off the power when the multimeter is idle, which affects the battery life. Therefore, there is room for improvement in the art

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
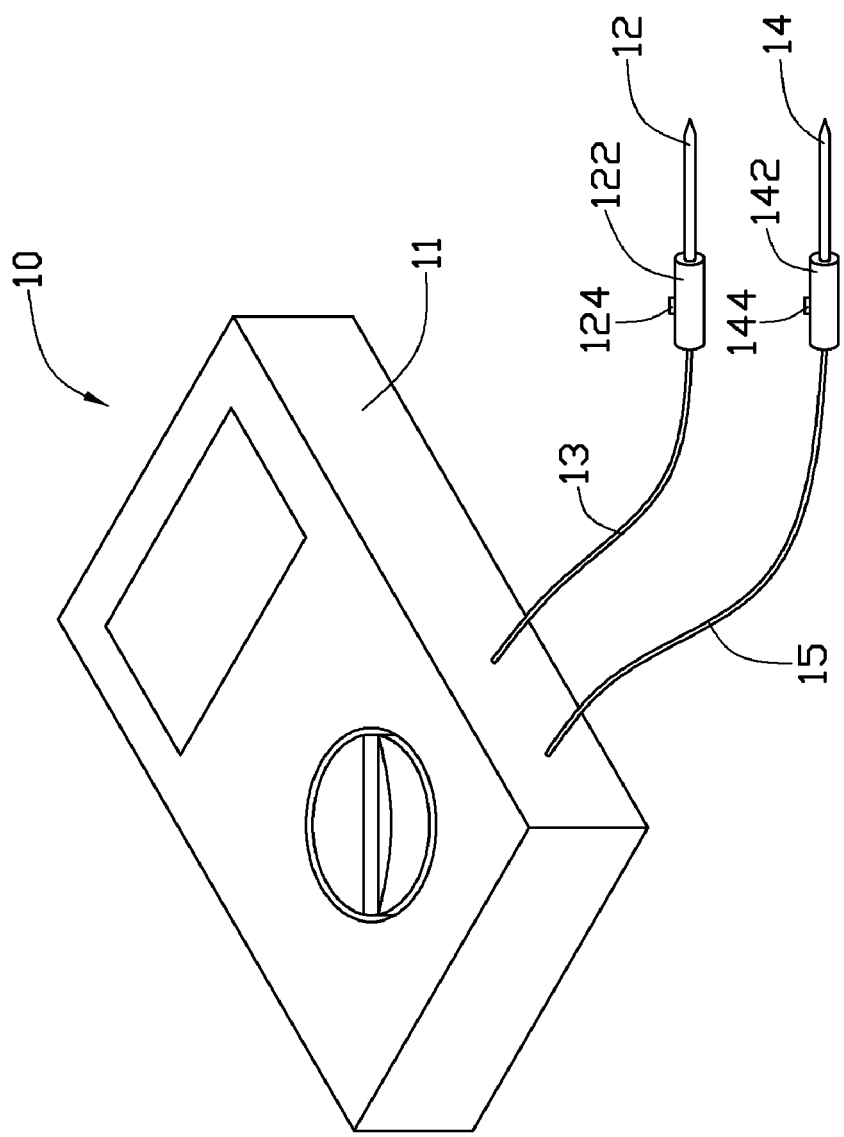
FIG. 1 is an isometric view of an exemplary embodiment of a multimeter.
Figure 2:
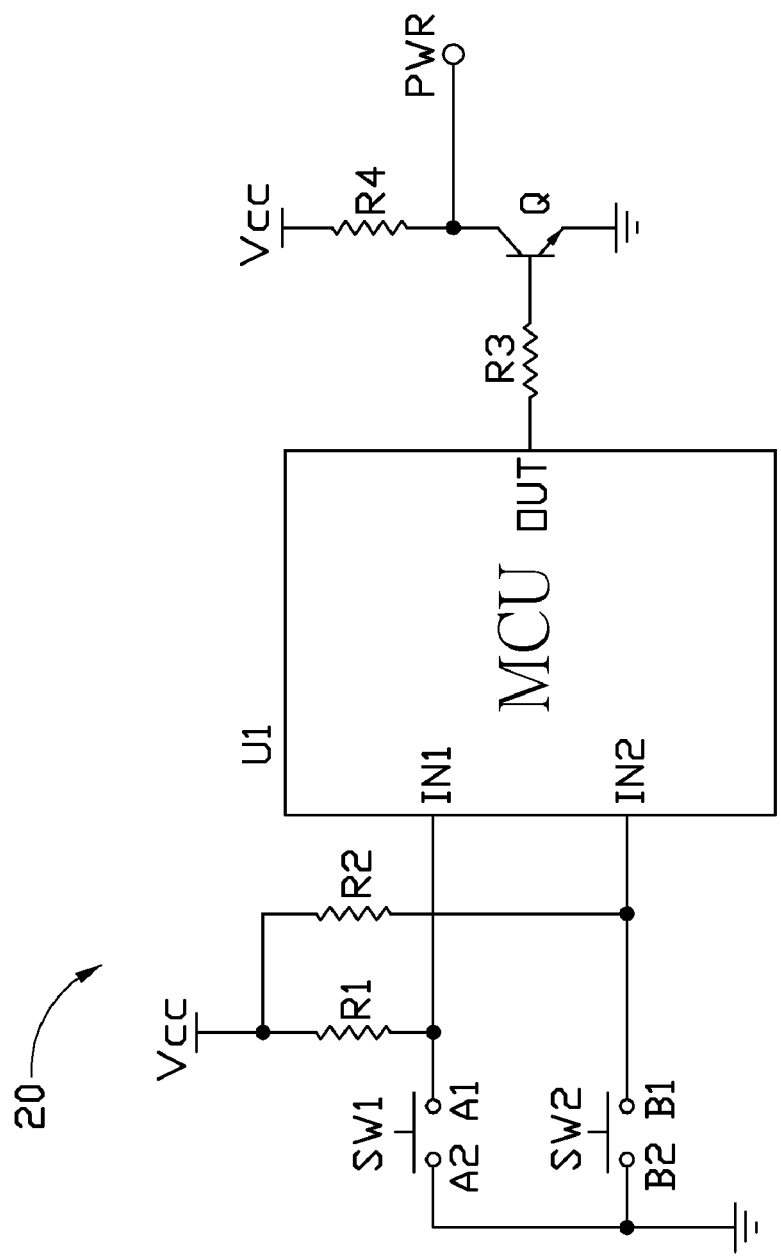
FIG. 2 is a circuit diagram of an exemplary embodiment of a switching circuit of the multimeter of FIG. 1.

Referring to FIGS. 1 and 2, an exemplary embodiment of a multimeter 10 includes a mainbody 11, two wires 13 and 15, the two wires 13 and 15 include several leads, two probes 12 and 14 to detect electrical characteristics of electrical devices or components, and a switching circuit 20 to control the mainbody 11 to power on or off. The switching circuit 20 arranges in the mainbody 11. Each of the wires 13 and 15 includes at least two leads.

A column-shaped mounting member 122 forms on a distal end of the wire 13, to mount the probe 12. A column-shaped mounting member 142 forms on a distal end of the wire 15, to mount the probe 14. A first button 124 forms on the mounting member 122, and a second button 144 forms on the mounting member 142.

The switching circuit 20 includes a micro control unit (MCU) U1, a first normally-open switch SW1, a second normally-open switch SW2, and an n-channel transistor Q. A first terminal A1 of the first normally-open switch SW1 couples to a first input terminal IN1 of the MCU U1 and couples to a power supply $V_{cc}$ via a resistor R1. A first terminal B1 of the second normally-open switch SW2 couples to a second terminal IN2 of the MCU U1 and couples to the power supply $V_{cc}$ via a resistor R2. Second terminals of the first and second normally-open switches SW1 and SW2 are grounded. A base of the transistor Q connects to an output terminal OUT of the MCU U1 via a resistor R3, an emitter of the transistor Q is grounded, a collector of the transistor Q connects to the power supply $V_{cc}$ via a resistor R4 and couples to a power control terminal PWR. The first and second buttons 124 and 144 (see FIG. 1) are respectively configured to close or open the first and second normally-open switches SW1 and SW2. The first normally-open switch SW1 is insulated from the probe 12, the second normally-open switch SW2 is insulated from the probe 14. The probes 12 and 14 are respectively electrically connected to the mainbody 11 through corresponding leads of the wires 13 and 15. The first and second normally-open switches SW1 and SW2 are electrically connected to the MCU U1 via other leads of the wires 13 and 15, respectively.

In one embodiment, the transistor Q may be replaced by other types of electronic switches, such as a metal-oxide-semiconductor field-effect transistor. The first and second normally-open switches SW1 and SW2 may be replaced by other types of switches, such as tactile switches.

In use, the first and second buttons 124 and 144 respectively on the probes 12 and 14 are both pressed by a user, so the first and second switches SW1 and SW2 are closed. The MCU U1 detects the first and second input terminals IN1 and IN2 are at low voltage level, the output terminal OUT of the MCU U1 outputs a high voltage to the base of the transistor Q. The transistor Q turns on, the collector of the transistor Q outputs a control signal at low voltage level to the power control terminal PWR to control the multimeter 10 to power on.

When the multimeter 10 is idle, the first and second buttons 124 and 144 are not pressed, the first and second normally-open switches SW1 and SW2 are open. The MCU U1 detects the first and second input terminals IN1 and IN2 at high voltage level, the output terminal OUT of the MCU U1 outputs a low voltage to the base of the transistor Q after a period of time T. The transistor Q turns off, the collector of the transistor Q outputs a control signal at high voltage level to the power control terminal PWR to control the multimeter 10 to power off. The period of time T may be predetermined by a program written to the MCU U1.

The MCU U1 includes a debounce circuit connected to the first and second input terminals IN1 and IN2. The MCU U1 outputs a high voltage only when the voltages at the first and second input terminals both remain at high level for a predetermined time to avoid accidental malfunction.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A multimeter comprising:
a power control terminal; and
a switching circuit comprising a micro control unit (MCU), a first normally-open switch, a second normally-open switch, and an electronic switch;
wherein a first terminal of the first normally-open switch couples to a first input terminal of the MCU and couples to a power supply via a first resistor, a first terminal of the second normally-open switch couples to a second input terminal of the MCU and couples to the power supply via a second resistor, a second terminal of the first normally-open switch and a second terminal of the second normally-open switch are grounded;
wherein a first terminal of the electronic switch connects to an output terminal of the MCU, a second terminal of the electronic switch is grounded, a third terminal of the electronic switch connects to the power supply via a third resistor and connects to the power control terminal, wherein when the first terminal of the electronic switch is at high voltage level the electronic switch turns on; and
wherein the output terminal of the MCU outputs a high voltage in response to the first and second input terminals of the MCU being at low voltage level, thereby the electronic switch turns on, the third terminal of the electronic switch outputs a control signal at low voltage level to power on the multimeter.

2. The multimeter of claim 1, further comprising two wires and two probes electrically connected to distal ends of the wires, respectively, wherein a mounting member on the distal end of each wire to mount a corresponding probe, a button on each mounting member is configured to close the first and second normally-open switches, the first and second normally-open switches are insulated from the probes.

3. The multimeter of claim 1, wherein the electronic switch is an n-channel bipolar junction transistor, the first, second, and third terminals of the electronic switch respectively corresponds to a base, an emitter, and a collector of the transistor.

* * * * *